(12) United States Patent
Huang et al.

(10) Patent No.: US 7,829,472 B2
(45) Date of Patent: Nov. 9, 2010

(54) METHOD OF FORMING AT LEAST AN OPENING USING A TRI-LAYER STRUCTURE

(75) Inventors: Wei-Hang Huang, Kaohsiung County (TW); Kai-Siang Neo, Johor (MY); Pei-Yu Chou, Tainan County (TW); Jiunn-Hsiung Liao, Tainan Hsien (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 344 days.

(21) Appl. No.: 12/099,788

(22) Filed: Apr. 9, 2008

(65) Prior Publication Data
US 2009/0258499 A1    Oct. 15, 2009

(51) Int. Cl.
*H01L 21/214* (2006.01)
(52) U.S. Cl. .................. 438/734; 438/706; 438/736; 438/738
(58) Field of Classification Search .......... 438/40, 438/43, 706, 734, 736, 738
See application file for complete search history.

(56) References Cited

U.S. PATENT DOCUMENTS 5,872,045 A * 2/1999 Lou et al. .................. 438/432
2005/0236366 A1 * 10/2005 Liu ............................. 216/79
2008/0032508 A1 * 2/2008 Chang ....................... 438/725
2008/0099435 A1 * 5/2008 Grimbergen ................. 216/60
2009/0004875 A1 * 1/2009 Shen et al. ................. 438/735

* cited by examiner

*Primary Examiner*—Fernando L Toledo
(74) *Attorney, Agent, or Firm*—Winston Hsu; Scott Margo; Min-Lee Teng (57) ABSTRACT

A method of forming openings is disclosed. A substrate is first provided, and the tri-layer structure is formed on the substrate. The tri-layer structure includes a bottom photoresist layer, a silicon-containing layer and a top photoresist layer form bottom to top. Subsequently, the top photoresist layer is patterned, and the silicon-containing layer is etched by utilizing the top photoresist layer as an etching mask to partially expose the bottom photoresist layer. Next, the partially exposed bottom photoresist layer is etched through two etching steps in turn by utilizing the patterned silicon-containing layer as an etching mask. The first etching step includes an oxygen gas and at least one non-carbon-containing halogen-containing gas, while the second etching step includes at least one halogen-containing gas. The substrate is thereafter etched by utilizing the patterned bottom photoresist layer as an etching mask to form at least an opening in the substrate.

13 Claims, 7 Drawing Sheets

METHOD OF FORMING AT LEAST AN OPENING USING A TRI-LAYER STRUCTURE

BACKGROUND OF THE INVENTION

1. Field of the Invention

The present invention relates to a method of forming at least an opening by utilizing a tri-layer structure, and more particularly, to a method of forming at least an opening by performing a multiple-step etching process.

2. Description of the Prior Art

As the semiconductor processes advance to very deep submicron era, such as 65 nm processes or beyond, controlling the critical dimension (CD) of components in the integrated circuits has become a critical issue in the art.

As the critical dimension (CD) keeps shrinking, the actual gate pattern and gate profile are influenced by aspect ratio of the gate in etching process. Furthermore, the AEI (after etch inspection) CD is susceptible to loading effect. There are different pattern densities in a chip (hence in a wafer). For etching, it is easy to happen loading effect between iso-region (region having isolated patterns) and dense-region (region having dense patterns).

Figure 1:
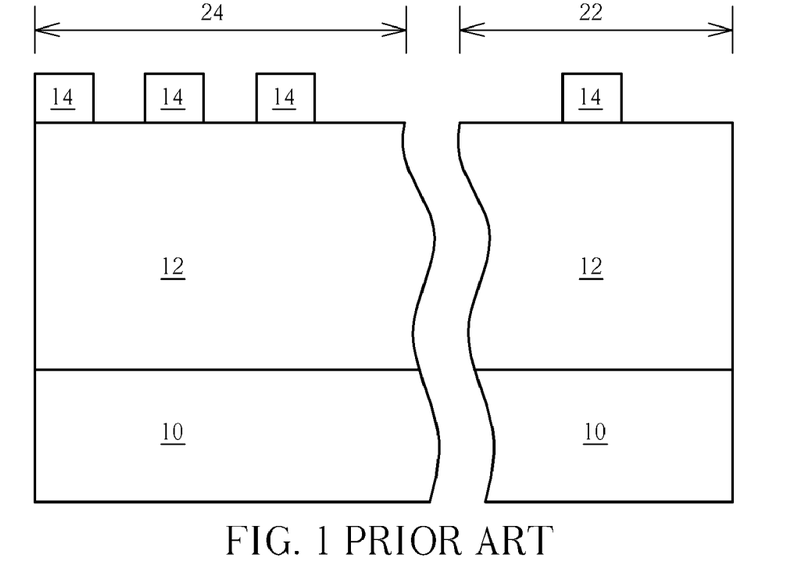
FIG. 1 and FIG. 2 are schematic diagrams illustrating a conventional method of forming openings.
Figure 2:
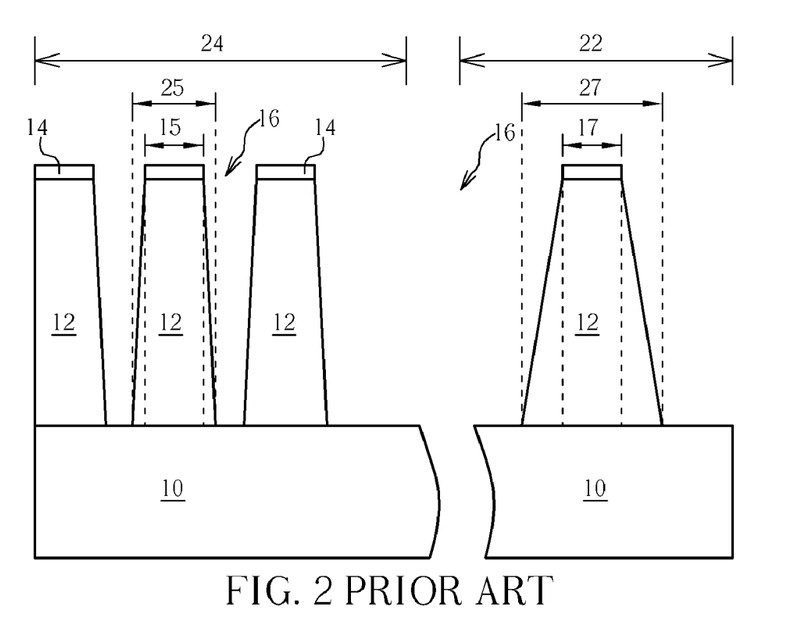

Please refer to FIG. 1 and FIG. 2, which are schematic diagrams illustrating a conventional method of forming openings. As shown in FIG. 1, a substrate 10 is first provided. A film 12 is formed on the substrate 10, and a patterned mask 14 is formed on the film 12. The patterned mask 14 is utilized to define a predetermined pattern of the film 12, or even a predetermined pattern of the substrate 10. According to the predetermined pattern, an iso-region 22 (region having isolated patterns) and a dense-region 24 (region having dense patterns) are defined on the substrate 10.

As shown in FIG. 2, an etching process is subsequently performed on the film 12 by utilizing the patterned mask 14 as an etching mask to form openings 16 in the film 12 and to expose the substrate 10. Because the iso-region 22 possess larger openings 16 in surface area than dense-region 24, etchant can contact and react with more material in the iso-region 22, and more by-products are produced in the iso-region 22. Consequently, the influence on the surface of the wafer after the etching process is adversely different due to the loading effect. The loading effect undesirably makes the bottom AEI CD 25 of the resulted pattern larger than the predetermined CD 15 of the defined pattern in dense-region 24, and the difference between the bottom AEI CD 27 of the resulted pattern and the predetermined CD 17 of the defined pattern in the iso-region 22 is even more.

However, both an over-large CD bias of the patterns and an undesired profile of the patterns can lead to structural defeats in the chip or in the wafer. Therefore, there is still a need for a novel etching process to solve the issues of large CDs and bad loadings in iso-region/dense-region (I/D) as described above.

SUMMARY OF THE INVENTION

The objective of the present invention is to provide a method of forming at least an opening to control the CD and the pattern profiles in iso-region and dense-region.

The method of forming at least an opening according to the present invention comprises steps as follows. First, a substrate is provided. Subsequently, a tri-layer structure is formed on the substrate. The tri-layer structure includes a bottom photoresist layer on the substrate, a silicon-containing layer on the bottom photoresist layer, and a top photoresist layer on the silicon-containing layer. Next, the top photoresist layer is patterned. Furthermore, a first etching process is performed on the silicon-containing layer by utilizing the patterned top photoresist layer as an etching mask to pattern the silicon-containing layer and to partially expose the bottom photoresist layer. Next, a second etching process is performed on the partially exposed bottom photoresist layer by utilizing the patterned silicon-containing layer as an etching mask to partially expose the substrate. The second etching process uses an oxygen gas and one or more halogen-containing gas. Following that, the partially exposed substrate is etched by utilizing the patterned bottom photoresist layer as an etching mask to form at least an opening in the substrate.

In another aspect of the present invention, a method of forming at least an opening using a tri-layer structure is provided. The method comprises steps as follows. First, a substrate is provided. Subsequently, a tri-layer structure is formed on the substrate. The tri-layer structure includes a bottom photoresist layer on the substrate, a silicon-containing layer on the bottom photoresist layer, and a top photoresist layer on the silicon-containing layer. Next, the top photoresist layer is patterned. Furthermore, a first etching process is performed on the silicon-containing layer by utilizing the patterned top photoresist layer as an etching mask to pattern the silicon-containing layer and to partially expose the bottom photoresist layer. Next, a second etching process is performed on the partially exposed bottom photoresist layer by utilizing the patterned silicon-containing layer as an etching mask to remove parts of the bottom photoresist layer. The second etching process uses an oxygen gas and at least one non-carbon-containing halogen-containing gas. Following that, a third etching process is performed on the bottom photoresist layer remaining on the substrate by utilizing the patterned silicon-containing layer as an etching mask to partially expose the substrate. The third etching process uses at least one halogen-containing gas. Thereafter, the partially exposed substrate is etched by utilizing the patterned bottom photoresist layer as an etching mask to form at least an opening in the substrate.

In another aspect of the present invention, a method of forming at least an opening using a tri-layer structure is provided. The method comprises steps as follows. First, a substrate is provided. Subsequently, a tri-layer structure is formed on the substrate. The tri-layer structure includes a bottom photoresist layer on the substrate, a silicon-containing layer on the bottom photoresist layer, and a top photoresist layer on the silicon-containing layer. Next, the top photoresist layer is patterned. Furthermore, a first etching process is performed on the silicon-containing layer by utilizing the patterned top photoresist layer as an etching mask to pattern the silicon-containing layer and to partially expose the bottom photoresist layer. Next, a second etching process is performed on the partially exposed bottom photoresist layer by utilizing the patterned silicon-containing layer as an etching mask to remove parts of the bottom photoresist layer. The second etching process uses an oxygen gas and at least one non-carbon-containing halogen-containing gas. Following that, a third etching process is performed on the bottom photoresist layer remaining on the substrate and the substrate by utilizing the patterned silicon-containing layer as an etching mask to form at least an opening in the substrate. The third etching process uses at least one halogen-containing gas.

In the method of the present invention, a tri-layer structure is used to form at least an opening having a proper shape and a proper CD in the substrate. The substrate can be a material layer of a wafer, a composite material layer of a wafer, multiple layers of a wafer, or a hard mask layer used to pattern other material layers. And, the substrate can have any kind of devices thereon such as transistors, diodes, isolation structures, memory cells, capacitors, inductors, interconnects.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the method of forming at least an opening according to the present invention, a tri-layer photoresist structure is utilized to pattern a hard mask layer, a material layer, a composite material layer or multiple layers. For patterning the bottom photoresist layer of the tri-layer structure, two etching steps can be applied in the present invention. The first etching step can use one or more non-carbon-containing halogen-containing gas, such as bromide hydride (HBr), chlorine ($Cl_2$) and oxygen ($O_2$), and is helpful to provide a good uniformity without I/D loading effect. The second etching step can use one or more halogen-containing gas, such as carbon tetrafluoride ($CF_4$), difluoromethane ($CH_2F_2$) and trifluoromethane ($CHF_3$), and is helpful to provide a good passivation so as to make the profile taper. It is to be noted that the first and second etching steps for patterning the bottom photoresist layer can use other gases such as nitrogen ($N_2$), helium (He) for gas dilution or process progressing.

Figure 3:
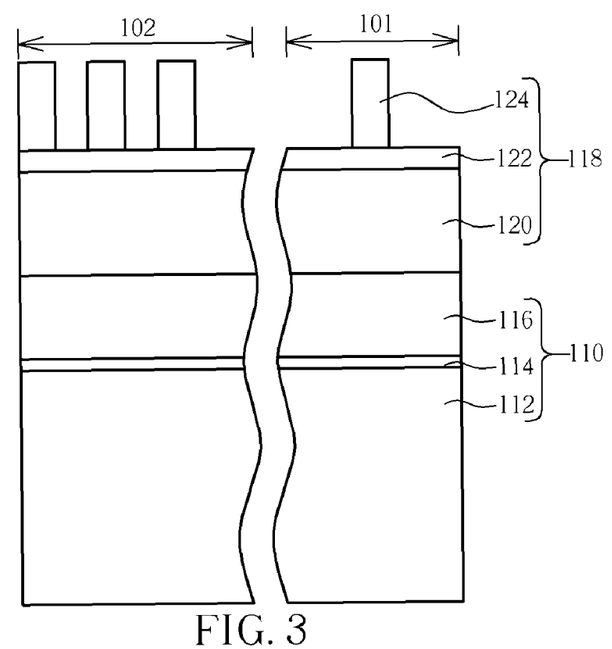
FIG. 3 through to FIG. 11 are schematically cross-sectional diagrams showing a method of forming at least an opening using a tri-layer structure according to a first embodiment of the present invention.

Please refer to FIG. 3 to FIG. 11. FIG. 3 through FIG. 11 are schematically cross-sectional diagrams showing a method of forming at least an opening using a tri-layer structure according to a first embodiment of the present invention, where like numbered numerals designate similar or the same parts, regions or elements. It is to be understood that the drawings are not drawn to scale and are served only for illustration purposes. First, as shown in FIG. 3, a substrate 110 is provided. The substrate 110 includes a silicon (Si) layer 112, a pad oxide layer 114 and a silicon nitride (SiN) layer 116 in this embodiment. The Si layer 112 can be a target layer for patterning, the SiN layer 116 can be a hard mask (HM) during etching processes, and the pad oxide layer 114 can be a buffer layer or a glue layer between the Si layer 112 and the SiN layer 116. In other embodiments, the Si layer 112, the pad oxide layer 114 and the SiN layer 116 can be replaced by other material layers, and the substrate 110 can include silicon-containing materials, low dielectric constant (low-k) materials, oxide-containing materials, polysilicon, silicon nitride compounds ($Si_xN_y$), silicon carbide (SiC), silicon carbon compounds ($Si_xC_y$), titanium nitride (TiN), strained silicon, strained silicon-on-insulator, or any combination thereof.

A multi-layer stacked structure, such as a tri-layer structure 118, is substantially formed on the SiN layer 116. From bottom to top, the tri-layer structure 118 may include a bottom photoresist layer 120 on the substrate 110, a silicon-containing layer 122 on the bottom photoresist layer 120, and a top photoresist layer 124 on the silicon-containing layer 122. After the tri-layer structure 118 is formed on the substrate 110, a photolithographic process is next performed to pattern the top photoresist layer 124. According to the predetermined pattern, an iso-region 101 (region having isolated patterns) and a dense-region 102 (region having dense patterns) are defined on the substrate 110.

In this embodiment, the bottom photoresist layer 120, which may improve adhesion and provide a function of anti-reflection, can include 365 nm photoresist (I-line) or novolac resin (I-line like) and also named an under-layer or a bottom anti-reflective coating (BARC). The silicon-containing layer 122 can includes silicon-containing polymers, such as a polymer containing 10-30% silicon, and has a function of anti-erosion. The top photoresist layer 124 can be a 193 nm photoresist layer, which may be relatively thin, and accordingly, the resolution may be improved. Please notice that the thicknesses of both the top photoresist layer 124 and the bottom photoresist layer 120 can be thinner due to the tri-layer structure 118. A thinner top photoresist layer 124 is helpful for controlling CD, and avoiding line collapses.

Figure 4:
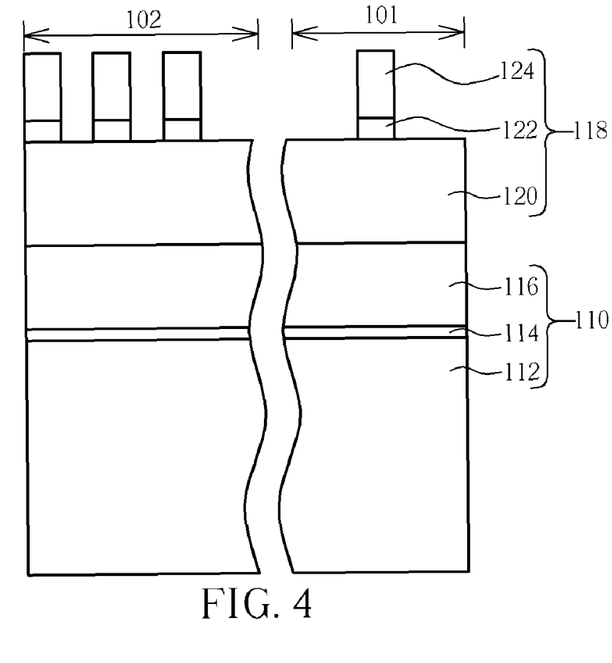

Subsequently, as shown in FIG. 4, an etching process, such as a plasma etching process, is performed on the silicon-containing layer 122 by utilizing the patterned top photoresist layer 124 as an etching mask to pattern the silicon-containing layer 122 and to partially expose the bottom photoresist layer 120. In this etching process, the thickness of the top photoresist layer 124 is reduced, and a plurality of openings can be formed in the silicon-containing layer 122.

Figure 5:
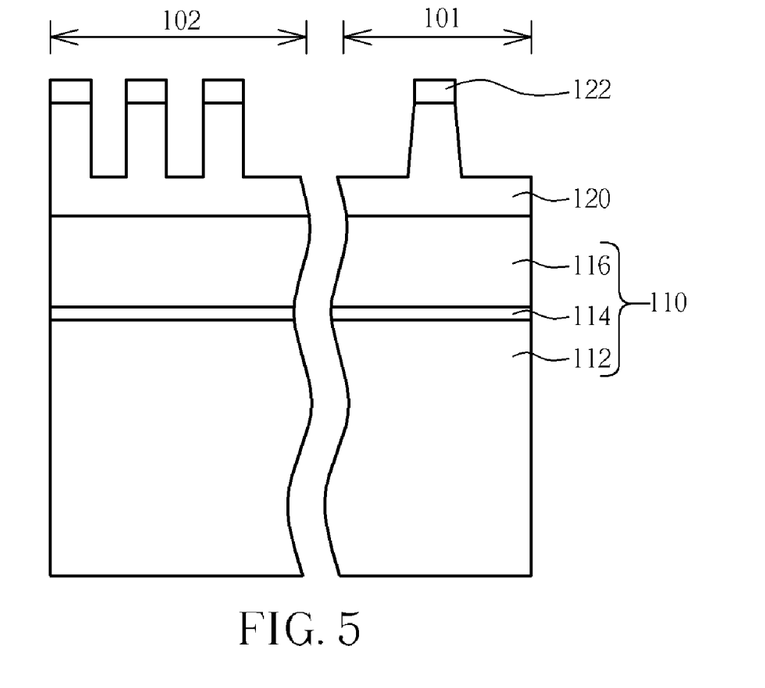

Afterwards, the procedure for etching the bottom photoresist layer 120 can be divided into at least two steps. In the first etching step, as shown in FIG. 5, another etching process, such as a plasma etching process, can be performed on the partially exposed bottom photoresist layer 120 by utilizing the patterned silicon-containing layer 122 as an etching mask to remove parts of the bottom photoresist layer 120. Generally, the top photoresist layer 124 would be completely consumed in the first etching step, and no remaining top photoresist layer 124 would interfere with the following etching process. If the top photoresist layer 124 is not completely consumed, it can also be removed by performing another etching process or an ashing process. Please notice that the openings of the bottom photoresist layer 120 do not expose the substrate 110 after the first etching step. In other words, the first etching step does not etch through the bottom photoresist layer 120.

In order to make the openings of the bottom photoresist layer 120 have a preferable profile, such as steep or vertical sidewalls, a strong etching ability can be applied to the first etching step so as to provide a great anisotropism. In other words, the first etching step can provide a good uniformity for patterning, and the structural difference caused by the loading effect between the iso-region 101 and the dense-region 102 can be effectively prevented. Accordingly, this etching process of the first etching step uses oxygen gas and one or more non-carbon-containing halogen-containing gas, such as bromide hydride (HBr) and chlorine ($Cl_2$). For example, a flowing rate of $O_2$ can be approximately 100 standard cubic centimeters per minute (sccm), a flowing rate of HBr can be approximately 100 sccm, a flowing rate of $N_2$ can be about 50 sccm, and a flowing rate of chlorine ($Cl_2$) gas can be about 20 sccm in this etching process.

Figure 6:
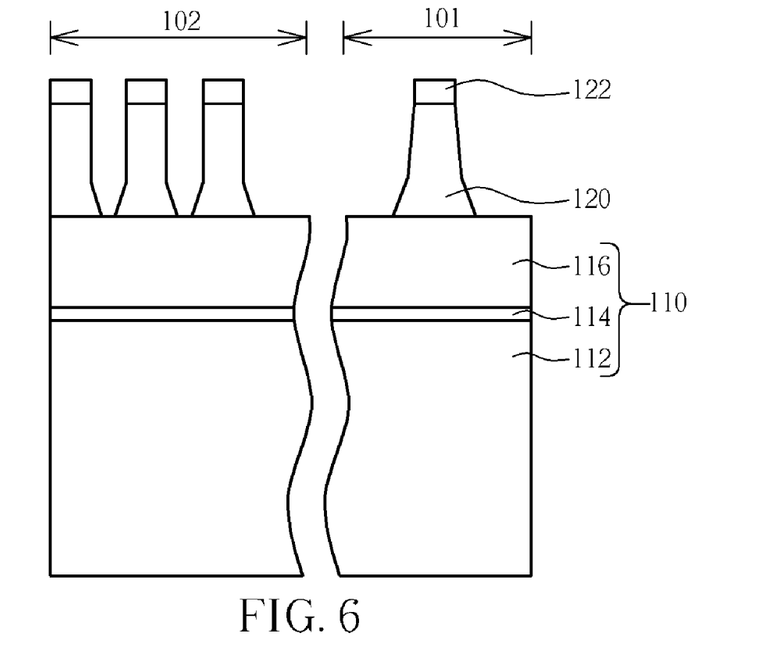

In the second etching step, as shown in FIG. 6, another etching process, such as a plasma etching process, is thereafter carried out on the remaining bottom photoresist layer 120 by utilizing the patterned silicon-containing layer 122 as an etching mask to partially expose the substrate 110. Further to prevent an over-large CD consumption of the bottom photoresist layer 120 in the dense-region 102, the second etching step is preferable to provide a good passivation for the remaining bottom photoresist layer 120. Accordingly, the process of the second etching step includes one or more halogen-containing gas, such as carbon tetrafluoride ($CF_4$) gas, Difluoromethane ($CH_2F_2$) and trifluoromethane ($CHF_3$) gas. For example, a flowing rate of $CF_4$ can be less then 40 sccm, preferably with 30 sccm, a flowing rate of the $CHF_3$ can be more than 65 sccm, preferably with 75 sccm, and a flowing rate of helium (He) gas can be about 180 sccm in the second etching step. Therefore, the second etching step can make the profile taper, prevents an over-consumption of the bottom photoresist layer 120, and is not liable to line collapses.

The bottom photoresist layer 120 can have both a proper profile and a proper line CD by adjusting the above two steps of etching the bottom photoresist layer 120. In other words, the recipes of the etching steps can be altered according to the characteristics of the etching steps and the top view of the dense-region 102 or the iso-region 101. One of the preferred recipes is that the operation time of the first etching step is in a range from 35 seconds to 56 seconds, and the operation time of the second etching step is in a range from 12 seconds to 71 seconds. It is appreciated that the time ratio can be varied according the predetermined patterns in the dense-region 102 and in the iso-region 101, the material of the etched layers, the expected patterned depth (height), and the parameters of the etching processes. Accordingly, each etching step or each etching process in the present invention can be performed in a time mode or in an end point mode. In other words, each etching step or each etching process in the present invention is applicable to an auto process control (APC) system. In a time mode, the etching step or process would not be stopped until performing for a predetermined time. In an end point mode, the etching step or process would not be stopped until exposing the underlying layer. It should be further noted that the bottom photoresist layer 120 can be etched through by the first etching step without the second etching step, or by the second etching step without the first etching step in other embodiments of the present invention.

Figure 7:
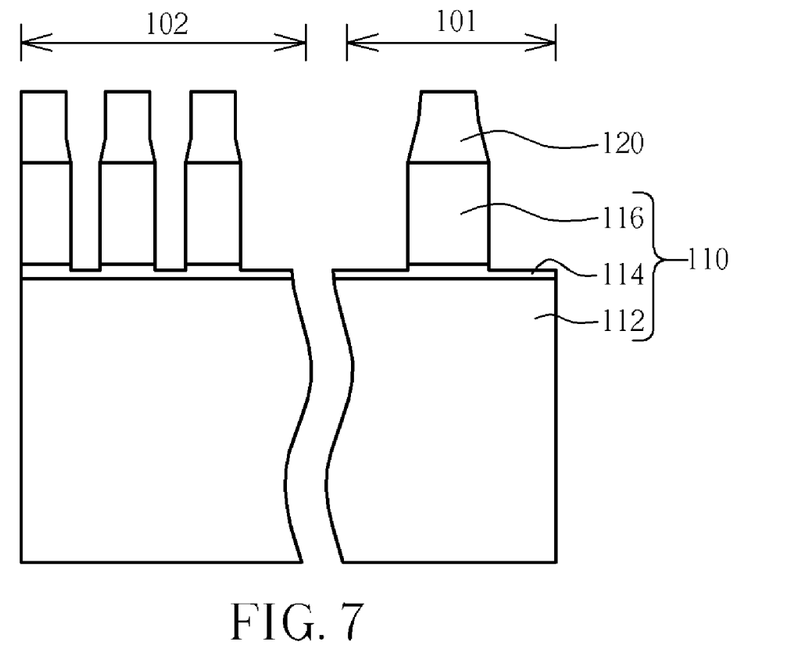

As shown in FIG. 7, another etching process, such as a plasma etching process, is next performed on the SiN layer 116 by using the patterned bottom photoresist layer 120 as an etching mask to pattern the SiN layer 116 and to form openings in the SiN layer 116. Because the SiN layer 116 is defined by using the well-patterned bottom photoresist layer 120 as an etching mask, the bottom photoresist layer 120 can be thinner. Additionally, parts of the pad oxide layer 114 may also be etched in this etching process. This etching process can also use one or more halogen-containing gas, but the recipe can be different from the above second etching step. For example, a flowing rate of $CF_4$ can be more then 40 sccm, preferably with 50 sccm, a flowing rate of the $CHF_3$ can be less than 65 sccm, preferably with 55 sccm, and a flowing rate of helium gas can be about 180 sccm in this etching process. In addition, it is noteworthy that the pressure of this etching process can be less than the pressure of the above second etching process so that the loading profile of the iso-region 101 and the loading profile of the dense-region 102 can be further improved. For instance, the pressure of this etching process can be about 3 milli-torrs, while the pressure of the above second etching process can be about 5 milli-torrs, and the etching rate in the iso-region 101 can be therefore more than or equal to the etching rate in the dense-region 102.

Figure 8:
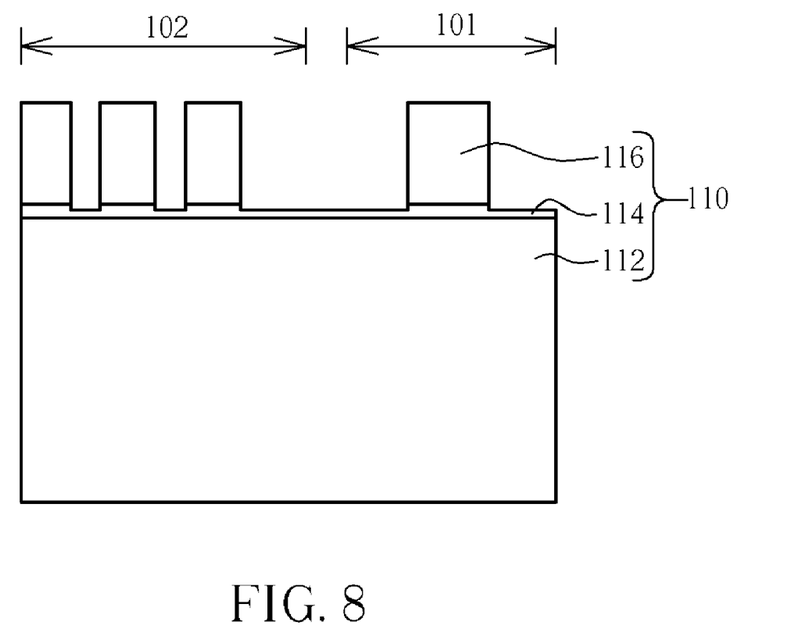
Figure 9:
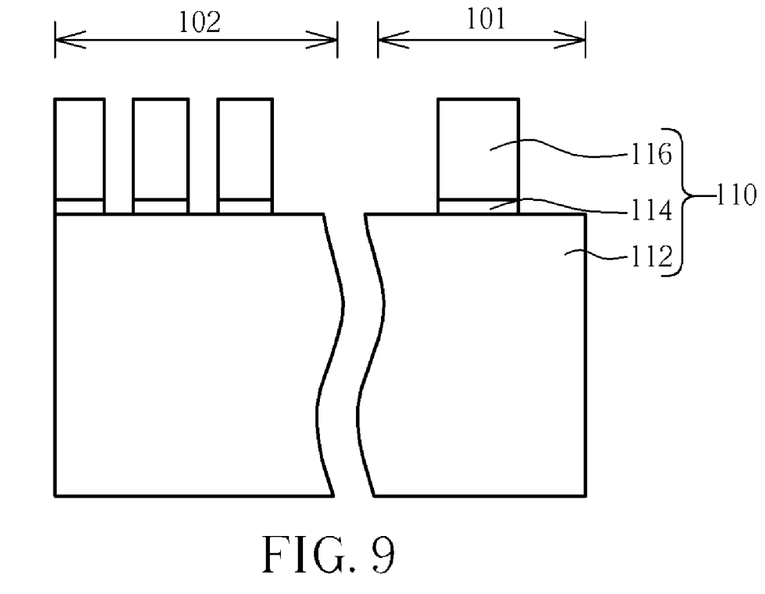
Figure 10:
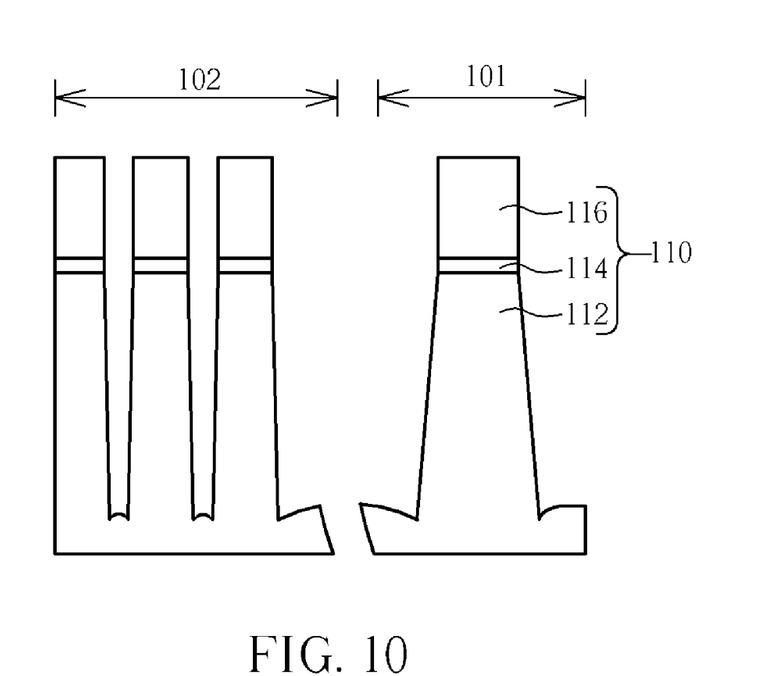

As shown in FIG. 8, the remaining bottom photoresist layer 120 (the remaining tri-layer structure 118) can be striped from the substrate 110. Next, as shown in FIG. 9, the uncovered parts of the pad oxide layer 114 are etched by another etching process to partially expose the underlying Si layer 112. Afterward, as shown in FIG. 10, another etching process is carried out on the Si layer 112 to form a plurality of trenches in the Si layer 112.

Figure 11:
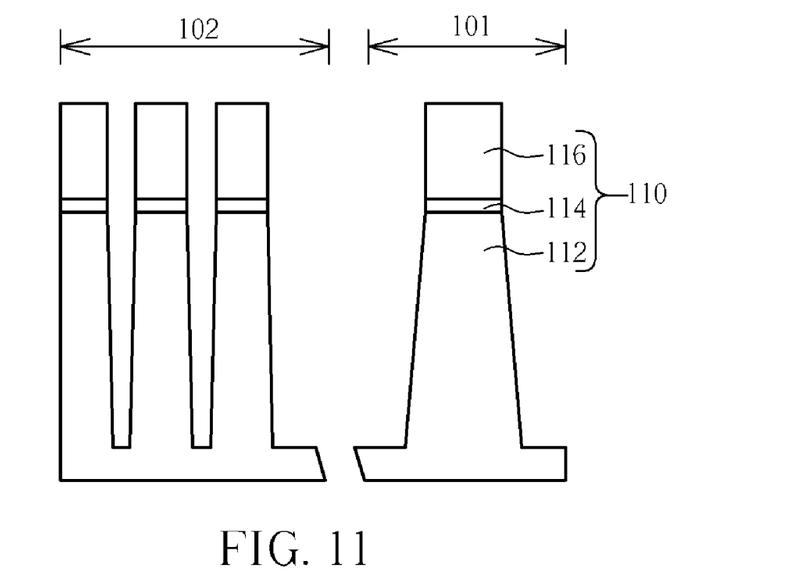

The SiN layer 116 has a high etching selectivity ratio to the Si layer 112, so the SiN layer 116 is used as the template for an etching transfer step to define and to form the pattern in the Si layer 112. Thereafter, as shown in FIG. 11, the bottoms of the trenches in the Si layer 112 are further trimmed by another etching process to form the predetermined openings in the Si layer 112. In addition, the remaining SiN layer 116 and the remaining pad oxide layer 114 can be removed (not shown in the drawings).

As a result, a tri-layer structure and a multiple-step etching process are used to form at least an opening having a proper profile and a proper CD in the substrate in the method of the present invention. For etching the bottom photoresist layer of the tri-layer structure, a first etching step using one or more non-carbon-containing halogen-containing gas and a second etching step using one or more halogen-containing gas are applied to the present invention. According to the method, the CD differences of the etched substrate or the etched material layer can be decreased, and the profiles can be improved. For example, the CD difference of the iso-region 101 can be in a range between 2.50 to 11.20 nanometers (nm) in some embodiments, while the CD difference of the dense-region 102 can be in a range between −3.30 to −6.50 nanometers (nm).

Figure 12:
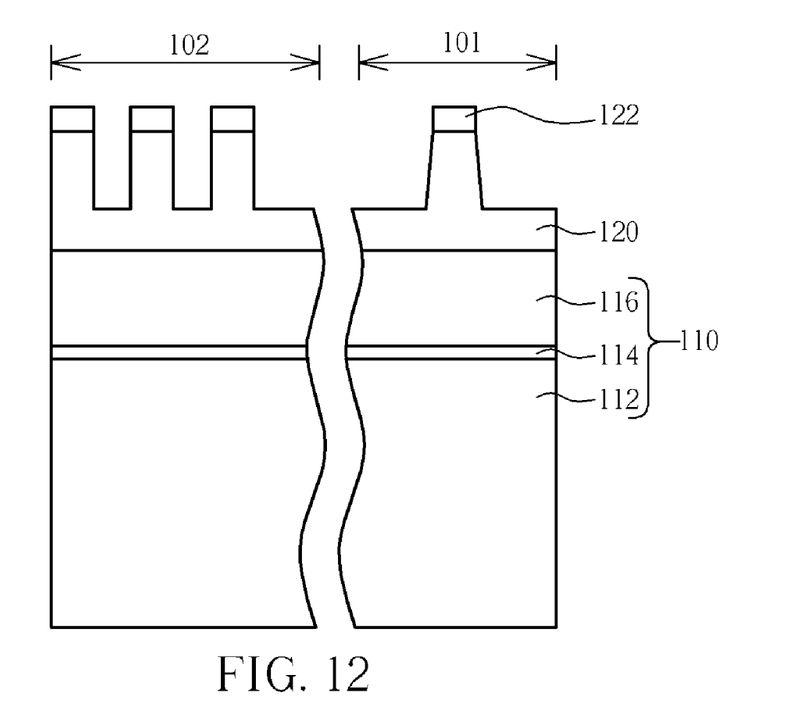
FIG. 12 through to FIG. 13 are schematically cross-sectional diagrams showing a method of forming at least an opening using a tri-layer structure according to a second embodiment of the present invention.
Figure 13:
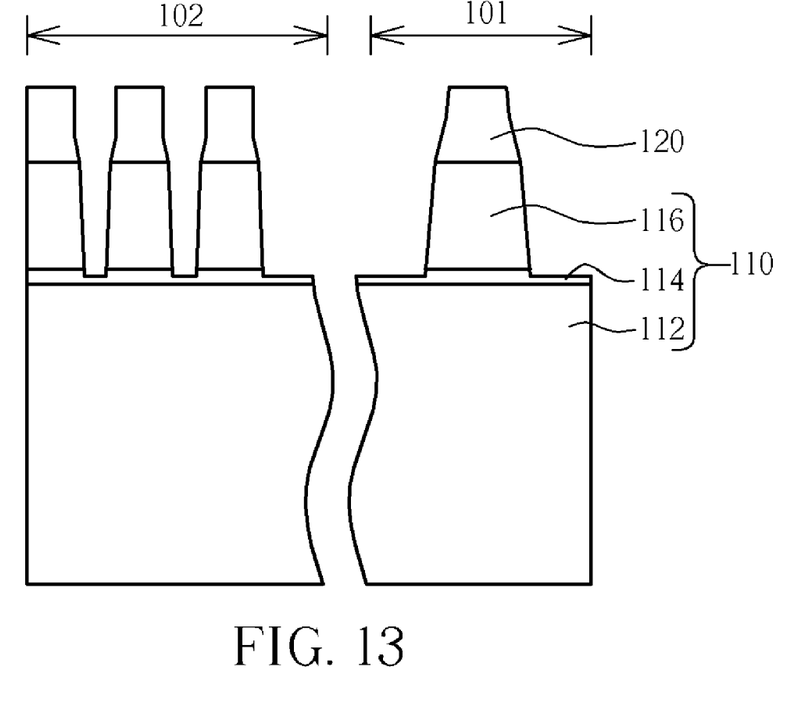

Furthermore, according to the method of the present invention described above, the present invention may be modified in various ways. Please refer to FIG. 12 and FIG. 13. FIG. 12 through to FIG. 13 are schematically cross-sectional diagrams showing a method of forming at least an opening using a tri-layer structure according to a second embodiment of the present invention, where like numbered numerals designate similar or the same parts, regions or elements. FIG. 12 shows a status following that of FIG. 5 described in the first embodiment.

As shown in FIG. 12, a substrate 110 is first provided. The substrate 110 includes a Si layer 112, a pad oxide layer 114 and a SiN layer 116. An iso-region 101 and a dense-region 102 are defined on the substrate 110. In the second embodiment, a tri-layer structure including a bottom photoresist layer 120, a silicon-containing layer 122 and a top photoresist layer (not shown) can also be formed on the substrate 110; the top photoresist layer can be next patterned; the silicon-containing layer 122 can be etched; and the first etching step can be thereafter performed to remove the top photoresist layer and parts of the bottom photoresist layer 120 according to the processes or steps shown in FIG. 3 through FIG. 5 of the first embodiment.

In the second etching step, as shown in FIG. 13, another etching process, such as a plasma etching process, can be carried out on both the remaining bottom photoresist layer 120 and the SiN layer 116 by utilizing the patterned silicon-containing layer 122 as an etching mask to partially expose the pad oxide layer 114. The flowing rate of $CF_4$ can be less then 40 sccm, the flowing rate of the $CHF_3$ can be more than 65 sccm, the flowing rate of helium gas can be about 180 sccm, and the process pressure can be about 5 milli-torrs in the second etching step to etch through the silicon-containing layer 122 and the SiN layer 116.

In other embodiments, the second etching step can etch both the remaining bottom photoresist layer 120 and the SiN layer 116, and does not etch through the SiN layer 116 (not shown in the drawings). In other words, the SiN layer 116 is further etched through by another process or etching step. It should be further noted that the second etching step could be multiple steps using different halogen containing gases form each other in other embodiments. The resulting substrate may be subsequently processed after the SiN layer 116 is etched as desired in other etching processes or other semiconductor manufacturing processes.

Since the tri-layer structure and the multiple-step etching process are applied to the method of the present invention, and the first etching step is helpful to provide a good uniformity without I/D loading effect, while the second etching step is helpful to provide a good passivation, hence the CD differences of the etched substrate or the etched material layer can be easily controlled, and the profiles can be improved simultaneously. Thus, each etching step or each etching process in the present invention is applicable to an APC system, and the performances of the processes are therefore improved.

Those skilled in the art will readily observe that numerous modifications and alterations of the device and method may be made while retaining the teachings of the invention.

What is claimed is:

1. A method of forming at least an opening using a tri-layer structure, comprising:
   providing a substrate;
   forming a tri-layer structure on the substrate, the tri-layer structure comprising a bottom photoresist layer on the substrate, a silicon-containing layer on the bottom photoresist layer, and a top photoresist layer on the silicon-containing layer;
   patterning the top photoresist layer;
   performing a first etching process on the silicon-containing layer by utilizing the patterned top photoresist layer as an etching mask to pattern the silicon-containing layer and to partially expose the bottom photoresist layer;
   performing a second etching process on the partially exposed bottom photoresist layer by utilizing the patterned silicon-containing layer as an etching mask to remove parts of the bottom photoresist layer, the second etching process using an oxygen gas and at least one non-carbon-containing halogen-containing gas;
   performing a third etching process on the partially exposed bottom photoresist layer remaining on the substrate by utilizing the patterned silicon-containing layer as an etching mask to partially expose the substrate, the third etching process using a halogen-containing gas; and
   etching the partially exposed substrate by utilizing the patterned bottom photoresist layer as an etching mask to form at least an opening in the substrate.

2. The method of claim 1 wherein the at least one non-carbon-containing halogen-containing gas comprises bromide hydride (HBr) or chlorine ($Cl_2$) or a combination thereof.

3. The method of claim 1 wherein the halogen-containing gas comprises carbon tetrafluoride ($CF_4$), Difluoromethane ($CH_2F_2$) or trifluoromethane ($CHF_3$) or a combination thereof.

4. The method of claim 1 wherein the substrate comprises silicon, polysilicon, silicon carbide, silicon nitride, titanium nitride, low-k material, oxide or a combination thereof.

5. The method of claim 1 wherein the first, second or third etching process is performed in a time mode.

6. The method of claim 1 wherein the first, second or third etching process is performed in an end point mode.

7. A method of forming at least an opening using a tri-layer structure, comprising:
   providing a substrate;
   forming a tri-layer structure on the substrate, the tri-layer structure comprising a bottom photoresist layer on the substrate, a silicon-containing layer on the bottom photoresist layer, and a top photoresist layer on the silicon-containing layer;
   patterning the top photoresist layer;
   performing a first etching process on the silicon-containing layer by utilizing the patterned top photoresist layer as an etching mask to pattern the silicon-containing layer and to partially expose the bottom photoresist layer;
   performing a second etching process on the partially exposed bottom photoresist layer by utilizing the patterned silicon-containing layer as an etching mask to remove parts of the bottom photoresist layer, the second etching process using an oxygen gas and at least one non-carbon-containing halogen-containing gas; and
   performing a third etching process on the partially exposed bottom photoresist layer and the substrate by utilizing the patterned silicon-containing layer as an etching mask to form at least an opening in the substrate, the third etching process using a halogen-containing gas.

8. The method of claim 7 wherein the at least one non-carbon-containing halogen-containing gas comprises bromide hydride (HBr) or chlorine ($Cl_2$) or a combination thereof.

9. The method of claim 7 wherein the halogen-containing gas comprises carbon tetrafluoride ($CF_4$), Difluoromethane ($CH_2F_2$) or trifluoromethane ($CHF_3$) or a combination thereof.

10. The method of claim 8 wherein the third etching process comprises a first etching step for etching the bottom photoresist layer and a second etching step for etching the substrate.

11. The method of claim 10 wherein a flowing rate of the $CF_4$ is less then 40 standard cubic centimeters per minute (sccm) and a flowing rate of the $CHF_3$ is more than 65 sccm in the first etching step.

12. The method of claim 7 wherein the first, second or third etching process is performed in a time mode.

13. The method of claim 7 wherein the first, second or third etching process is performed in an end point mode.

* * * * *